United States Patent
Matsubara et al.

(10) Patent No.: US 7,391,655 B2
(45) Date of Patent: *Jun. 24, 2008

(54) DATA PROCESSING SYSTEM AND NONVOLATILE MEMORY

(75) Inventors: Ken Matsubara, Higashimurayama (JP); Yoshinori Takase, Tokyo (JP); Tomoyuki Fujisawa, Takaraduka (JP)

(73) Assignee: Renesas Technology Corp., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/657,025

(22) Filed: Jan. 24, 2007

(65) Prior Publication Data

US 2007/0133278 A1    Jun. 14, 2007

Related U.S. Application Data

(62) Division of application No. 10/887,077, filed on Jul. 9, 2004, now Pat. No. 7,233,529.

(30) Foreign Application Priority Data

Aug. 27, 2003    (JP) ............................. 2003-302334

(51) Int. Cl.
*G11C 11/34* (2006.01)
*G11C 16/04* (2006.01)

(52) U.S. Cl. ..................... 365/185.3; 365/185.24; 365/185.29

(58) Field of Classification Search ............ 365/185.29, 365/185.3, 185.33, 185.24
See application file for complete search history.

(56) References Cited

U.S. PATENT DOCUMENTS

| 5,642,311 | A | 6/1997 | Cleveland et al. ......... 165/185.3 |
| 6,172,909 | B1 | 1/2001 | Haddad et al. .......... 365/185.19 |
| 6,252,803 | B1 | 6/2001 | Fastow et al. ........... 265/185.22 |
| 6,654,287 | B2* | 11/2003 | Visconti ................. 365/185.22 |

FOREIGN PATENT DOCUMENTS

JP    2000-260189    9/2000

* cited by examiner

*Primary Examiner*—A. Zarabian
*Assistant Examiner*—Michael J Weinberg
(74) *Attorney, Agent, or Firm*—Miles & Stockbridge PC (57) ABSTRACT

Erasing is performed with respect to a nonvolatile memory cell without causing depletion halfway therethrough. A control circuit for reversibly and variably controlling the threshold voltage of the nonvolatile memory cell by electrical erasing and writing controls an erase process of performing erasing to the plurality of nonvolatile memory cells assigned to one unit in an erase operation, a first write process of performing writing to the nonvolatile memory cell exceeding a pre-write-back level before a depletion level, and a second write process of performing writing to the nonvolatile memory cell exceeding a write-back level after the first write process. Since the occurrence of depletion is suppressed by successively performing the first write process with respect to the nonvolatile memory cells which may exceed the depletion level in the erase process, erasing can be performed to the nonvolatile memory cell without causing depletion halfway therethrough.

8 Claims, 12 Drawing Sheets

(COMPARISON BETWEEN NUMBERS OF REPEATED LOOPS N)

| FLOW | CHARACTERISTIC | TIME REQUIRED TO ERASE FASTEST MEMORY (tEPα) | TIME REQUIRED TO ERASE SLOWEST MEMORY (tEPβ) | ERASE BIAS APPLICATION TIME S1 (tEPi) | ERASE BIAS APPLICATION TIME S7 (tEPa=tEPα) | NUMBER OF REPEATED LOOPS (N=tEPβ/tEPα) |
|---|---|---|---|---|---|---|
| ERASING MEANS IN FIG. 10 (INITIALLY EXAMINED) | CHARACTERISTIC A | 100us | 1000us | 10us | tEPi | 100 |
| | CHARACTERISTIC B | 500us | 5000us | 10us | tEPi | 500 |
| ERASING MEANS IN FIG. 15 (HIGHER-SPEED) | CHARACTERISTIC A | 100us | 1000us | 10us | 100us | 10 |
| | CHARACTERISTIC B | 500us | 5000us | 10us | 500us | 10 |

FIG. 17

DATA PROCESSING SYSTEM AND NONVOLATILE MEMORY

This application is a divisional of application Ser. No. 10/887,077 now U.S Pat. No. 7,233,529, filed Jul. 9, 2004.

CROSS-REFERENCE TO RELATED APPLICATION

The present application claims priority from Japanese Patent Application JP 2003-302334 filed on Aug. 27, 2003, the content of which is hereby incorporated by reference into this application.

BACKGROUND OF THE INVENTION

The present invention relates to a semiconductor integrated circuit having nonvolatile memory cells each having a threshold voltage which can be changed reversibly by electrical erasing and writing and, more particularly to a technology for suppressing the over-erasing of the nonvolatile memory cell.

The foregoing nonvolatile memory cell has an erased state and a written state. The erased state is, e.g., a state in which a threshold voltage viewed from the select terminal of the memory cell is low and the written state is, e.g., a state in which the threshold voltage viewed from the select terminal of the memory cell is high. The select terminal of the nonvolatile memory cell is connected to a word line and an erase operation which lowers the threshold voltage of the nonvolatile memory cell is performed with respect to each of the memory cells connected to a selected word line. In the case of a nonvolatile memory cell having, e.g., a floating gate structure, a high voltage is applied to a word line so that electrons accumulated in the floating gate are released toward a source line or a substrate (a well region). At this time, there are often cases where a memory cell having a fast erase characteristic is in a depleted state (over-erased state) when the threshold voltage of a memory cell having a slowest erase characteristic reaches an erase verify level due to the different erase characteristics of the individual memory cells. After the threshold voltage of each of the memory cells connected to the selected word line reaches the erase verify level or lower, the process (write-back process) of rendering uniform the lower limit of the erase distribution by performing selective writing to each of memory cells having a threshold voltage not higher than the objective lower limit of the erase distribution. By performing this process, the depleted state is eliminated. Thus, the erase operation consists of two processes which are the process of lowering the threshold voltage (erase process) and the process (write-back process) of rendering uniform the lower limit of the threshold voltage distribution.

As a technology for preventing over-erasing, Patent Document 1 provides a control sequence which performs, after the erase operation, a leak check for detecting that the total sum of leakage currents in all the memory cells connected to a selected bit line is not more than a specified level, performs weak writing to each of the memory cells in an over-erased state by temporarily halting the erase operation when the result of the leak check is not OK, and returns to the erase operation.

[Patent Document 1] Japanese Unexamined Patent Publication No. 2000-260189

SUMMARY OF THE INVENTION

The present inventors have examined the case where the depleted state remains. If the foregoing write-back process is completed in the erase operation, there is no nonvolatile memory cell left in the depleted state. However, if the write-back process cannot be completed due to the shutdown of an operating power source halfway through the erase operation or the like, the depleted state remains. The nonvolatile memory in the depleted state is in a state which allows a current to flow or in the ON state even when a word line is unselected. In a memory cell array constructed such that a plurality of nonvolatile memory cells are connected in parallel between a bit line and the ground voltage of a circuit, if even at least one of the plurality of nonvolatile memory cells sharing the bit line is in the depleted state, the bit line of concern is constantly connected to the ground voltage of the circuit and the reading of data cannot be performed normally. There is a risk that the problem becomes apparent when such a nonvolatile memory is mounted on an IC card or a memory card which supports hot plug. Although the risk can be eliminated by taking extra measures against a power down delay associated with hot plug in an IC card or a memory card, the present inventors have considered that, to improve the reliability of anti-depletion measures in consideration of an application to another usage other than that with a card, measures are also taken preferably in a semiconductor integrated circuit having nonvolatile memory cells.

It is therefore an object of the present invention to provide a semiconductor integrated circuit which allows erasing to a nonvolatile memory cell without causing depletion halfway through the erase operation.

Another object of the present invention is to provide a semiconductor integrated circuit wherein, even if the shutdown of the operating power source occurs during the erase operation, a nonvolatile memory cell does not incur a depleted state.

Still another object of the present invention is to provide a semiconductor integrated circuit which allows high-speed erasing to a nonvolatile memory cell without incurring depletion halfway through the erase operation.

The above and other objects and novel features of the present invention will become apparent from the description of the present specification and the accompanying drawings.

The following is a brief description given to the outline of the representative aspects of the present invention disclosed in the present application.

Specifically, the semiconductor integrated circuit comprises: nonvolatile memory cells (MC) each having a threshold voltage which can be changed reversibly by electrical erasing and writing; and a control circuit (10) for controlling the changing of the threshold voltage of the foregoing nonvolatile memory cell. The foregoing control circuit controls: an erase process of performing simultaneous erasing to the plurality of nonvolatile memory cells assigned to one unit in an erase operation; a first write process (S5 and S6, S5a and S6) of performing writing to a specified one of the nonvolatile memory cells assigned to the foregoing one unit when a limit of a threshold voltage distribution in an erase direction exceeds a first level (Vpwb) before an over-erase limit (Vdprt) in the erase direction; and a second write process (S3) of performing writing to a specified one of the nonvolatile memory cells assigned to the foregoing one unit when the limit of the foregoing threshold voltage distribution in the erase direction is exceeding a second level (Vwb) before the over-erase limit in the erase direction after the foregoing first write process is completed. For example, the foregoing erasing is lowering the threshold voltage of each of the nonvolatile memory cells and the foregoing writing is increasing the threshold voltage of the nonvolatile memory cell.

The foregoing means suppresses the occurrence of depletion in each of the nonvolatile memory cells which may exceed the erase limit in the erase process by successively performing the first write process thereto. Erasing to the nonvolatile memory cell can be performed without causing depletion halfway therethrough. Even when the shutdown of an operating power source occurs during the erase operation, the nonvolatile memory cell is not brought into the depleted state.

To reduce or suppress the occurrence of an overhead time resulting from the addition of the first write process to the second write process corresponding to a write-back process, a first approach may be adopted appropriately which adjusts a write voltage applied to the nonvolatile memory cell in the foregoing first write process to be higher than a write voltage applied to the nonvolatile memory cell in the foregoing second write process. This allows coarse writing in terms of voltage and achieves a reduction in process time. A second approach may also be adopted appropriately which adjusts an application time during which a write voltage is applied to the nonvolatile memory cell in the foregoing first write process to be longer than an application time during which the foregoing write voltage is applied to the nonvolatile memory cell in the foregoing second write process. This allows coarse writing in terms of time and leads to a reduction in process time. For the implementation of the means, the foregoing first level is preferably closer to the foregoing over-erase limit than the foregoing second level.

As a specific embodiment of the present invention, the foregoing erase process is a process of causing a limit of the threshold voltage distribution in a counter-erase direction to reach an erase limit by repeating erase verify (S2) which determines whether or not the limit of the threshold voltage distribution in the counter-erase direction has reached an erase determination level (Vevfy) and erase voltage application (S1, S7) which applies an erase voltage when the erase determination level has not been reached. The foregoing first write process brings the limit of the threshold voltage distribution in the erase direction within a range under the foregoing first level by repeating a first write verify (S5, S5a) which determines whether or not the limit of the threshold voltage distribution in the erase direction exceeds the foregoing first level and first write voltage application (S6) which applies the write voltage when the first level is exceeded as a result of the determination by the first write verify.

As a first embodiment of the interrelation between the foregoing erase process and the first write process, the foregoing control circuit repeats a loop including the foregoing erase voltage application (S1) and the erase verify (S2), performs the first write verify (S5) halfway through the loop, and inserts the first write voltage application (S6) when the limit of the threshold voltage distribution in the erase direction exceeds the foregoing first level. The application of the erase voltage should be performed stepwise in terms of voltage or time. This is because, if the application of the erase voltage is performed abruptly, the limit of the threshold voltage distribution in the erase direction exceeds the over-erase limit at a time. If the number of loops repeating the foregoing erase voltage application and the erase verify is increased, an overhead time resulting from a switching operation to the loop is increased disadvantageously.

As a second embodiment for reducing the foregoing overhead time, the foregoing control circuit repeats a first loop (ROP1) including the foregoing erase voltage application (S1) and the first write verify (S5) until the limit of the threshold voltage distribution in the erase direction exceeds the foregoing first level, then repeats a second loop (ROP2) including the foregoing erase voltage application (S7) and the erase verify (S2), performs the first write verify (S5a) halfway through the foregoing second loop, and inserts the first write voltage application (S6) when the limit of the threshold voltage distribution in the erase direction exceeds the foregoing first level. This eliminates the risk that, even when the erase voltage application in the second loop is performed at a time provided that a cumulative application state such as a cumulative application time of erase voltage application in the foregoing first loop is not exceeded, the limit of the threshold voltage application in the erase direction exceeds the over-erase limit at a time. For example, an application time of one session of erase voltage application (S7) in the foregoing second loop (ROP2) may be adjusted to be longer than an application time of one session of erase voltage application (S1) in the foregoing first loop (ROP1). Alternatively, the application time of one session of erase voltage application in the foregoing second loop may be adjusted to correspond to a cumulative application time of erase voltage application in the foregoing first loop. In this sense, the number of times the second loop is repeated can be reduced and the overall overhead time resulting from the loop switching operation can be reduced.

As a specific embodiment of the present invention, a semiconductor integrated circuit (1, 20) has: a memory array (2) in which the foregoing plurality of nonvolatile memory cells (MC) are connected in parallel to bit lines (BL) and source lines (SL) to have respective select terminals connected individually to the word lines (WL). A selected one of the word lines is placed on a selected level and an unselected one of the word lines is placed on a non-selected level in a read operation. The semiconductor integrated circuit (20) further has: a nonvolatile memory (1) comprising the foregoing nonvolatile memory cells. The semiconductor integrated circuit (20) further has: a central processing unit (21) capable of accessing the foregoing nonvolatile memory to be constructed as a data processor. The foregoing control circuit (10) can also be composed of the foregoing central processing unit (21) and a memory region having an operation program therefor, such as one of the memory arrays (2).

The following is a brief description of effects achievable by the representative aspects of the present invention disclosed in the present application.

Specifically, the write process is performed with respect to the memory cell which may potentially be over-erased if the erase voltage is applied continuously so that erasing to the nonvolatile memory cell can be completed without causing depletion halfway therethrough. As a result, the nonvolatile memory cell does not incur the depleted state even when the shutdown of an operating power source occurs during the erase operation.

By detecting the state of erase voltage application till immediate before the nonvolatile memory cell having a fast erase characteristic is brought into the over-erased state in the first loop and reflecting the detected state on the application of the erase voltage in the subsequent erase/verify loop (second loop), the number of second loops can be reduced and the total overhead time resulting from loop switching can be reduced. This allows high-speed erasing of the nonvolatile memory cell without causing depletion halfway therethrough.

DESCRIPTION OF THE PREFERRED EMBODIMENTS

Figure 1:
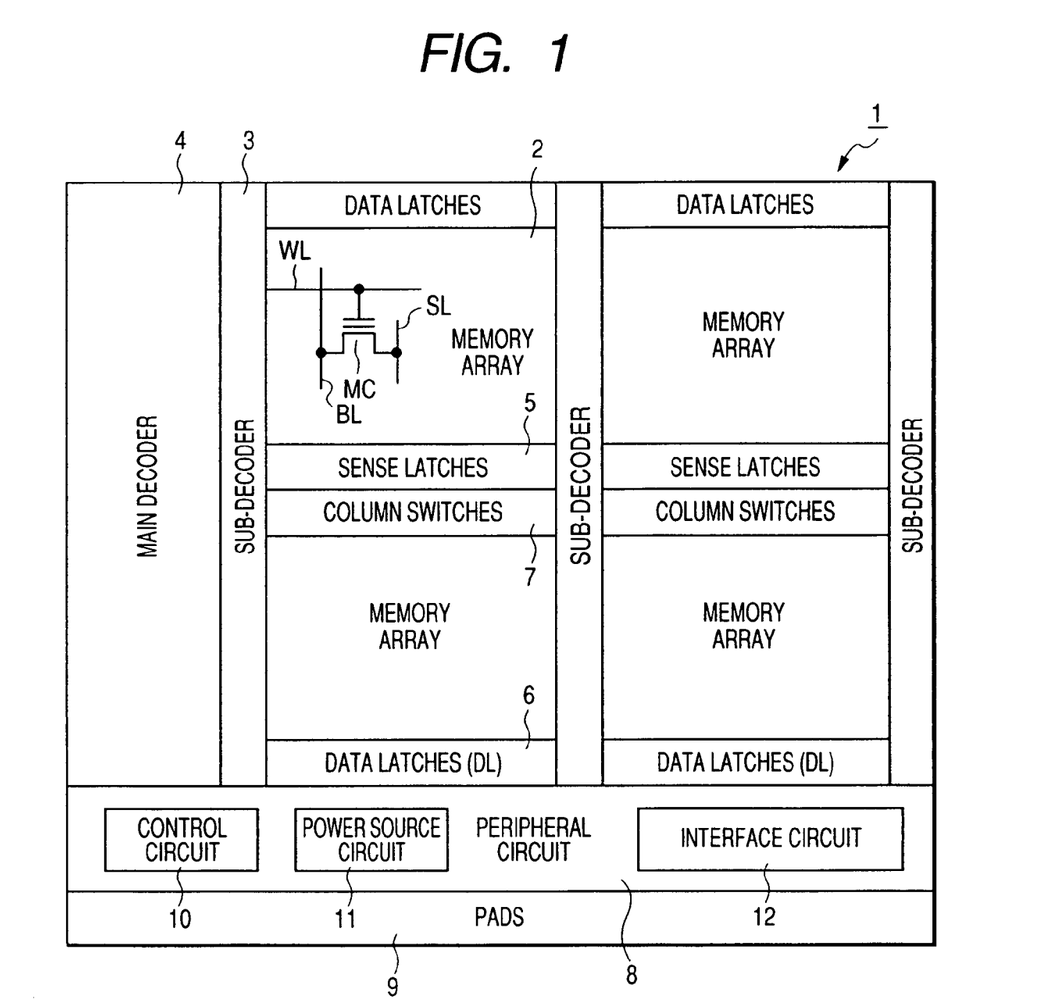
FIG. 1 is a block diagram showing a flash memory according to an embodiment of the present invention.

FIG. 1 shows a flash memory 1 according to an example of the present invention. The flash memory 1 is formed on a single semiconductor substrate made of single-crystal silicon or the like and comprises: a memory array 2; a sub-decoder 3; a main decoder 4; sense latches 5; data latches 6; column switches 7; peripheral circuits 8; and pads 9. The peripheral circuits 8 include: a power source circuit 11; a control circuit 10; and an interface circuit 12.

The foregoing memory array 2 has a large number of nonvolatile memory cells MC each having a threshold voltage which can be changed reversibly by electrical erasing and writing. In the present specification, erasing indicates lowering the threshold voltage of each of the nonvolatile memory cells MC and writing indicates increasing the threshold voltage of the nonvolatile memory cell. The nonvolatile memory cell MC has, e.g., a stacked gate structure having a floating gate and a control gate insulated from each other over a channel region between the source and drain. The nonvolatile memory cell MC has the control gate connected to a word line WL, the drain connected to a bit line BL, and the source connected to a source line SL. The selection of the word line and the selection of the bit line using the column switches 7 are performed based on a decode signal from the main decoder 4 and the sub-decoder 3 each for decoding an address signal. The bit line BL has one end connected to one of the sense latches 5 and the other end connected to one of the data latches 6. The data read from the nonvolatile memory cell through the selection of the word line for a read operation is sensed by using the data latch 6 and the sense latch 5 and transmitted as an access unit such as a byte or word selected by the column switch 7 to the interface circuit 12. An erase operation is not particularly limited but is performed on a per word-line basis. In a write operation, written data inputted to the interface circuit 12 is latched by the sense latch 5 via the column switch 7 so that the application of a write voltage and the removal thereof are controlled based on the logic value of the data latched by the sense latch 5.

The power source circuit 11 generates a source operating power such as a high voltage necessary for erasing and writing to the flash memory 1 or a word line boosting voltage necessary for reading by using a charge pump circuit, a resistance-type potential dividing circuit, and the like. The control circuit 10 controls the timings of erasing, writing, and reading to the flash memory 1 and the selection of the source operating power in response to a strobe signal and a command inputted thereto from the outside. The pads 9 have bonding pads connected to the outside and input/output buffers. In the example of FIG. 1, the control circuit 10 controls an erase procedure, which will be described later, and the like.

Figure 2:
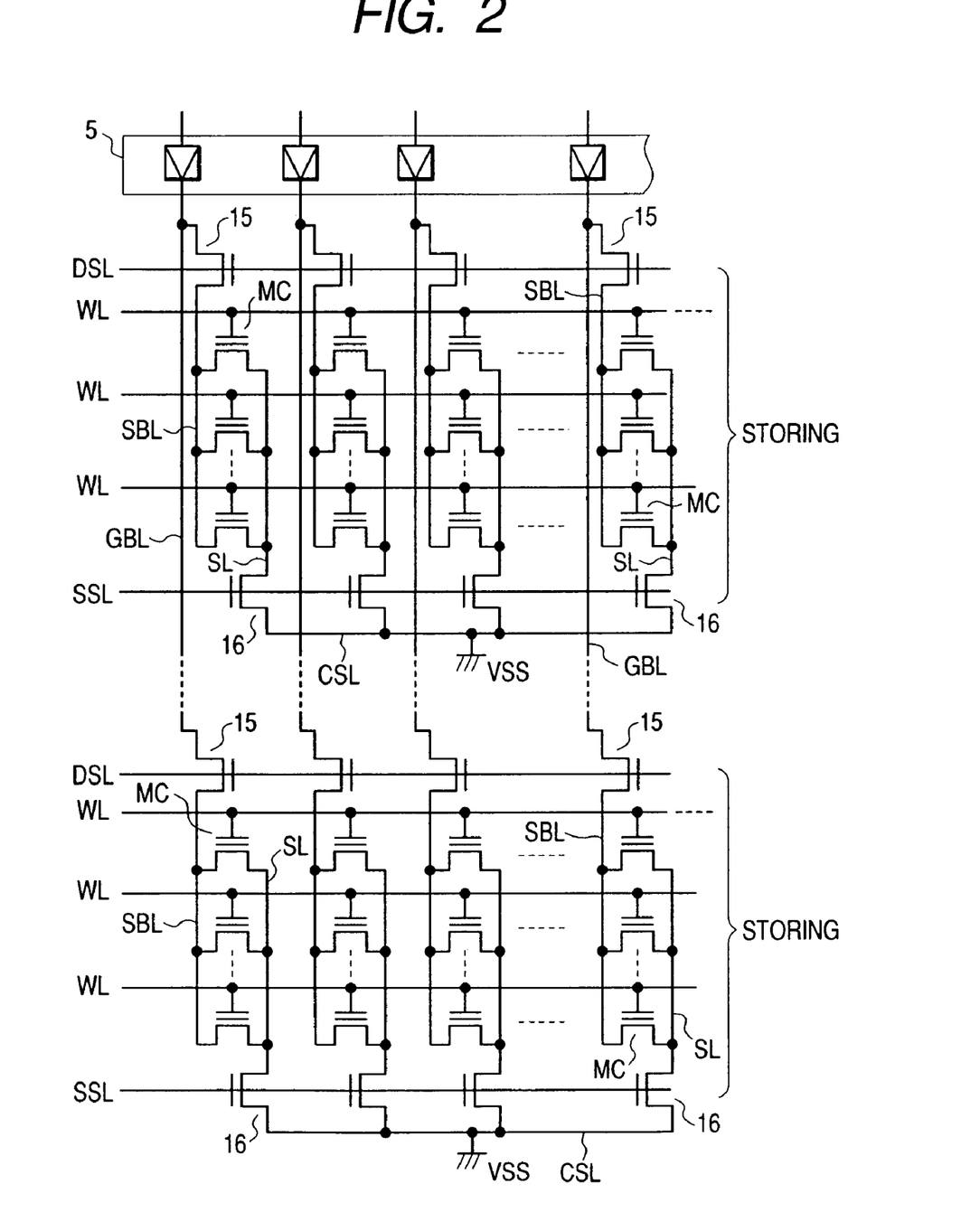
FIG. 2 is a circuit diagram showing an example of a memory array.

FIG. 2 shows an example of the memory array 2. In this example, the bit line BL has a divided bit line structure so that local bit lines SBL are connected to individual global bit lines GBL via select switches 15. A plurality of nonvolatile memory cells MC have respective drains connected to the local bit lines SBL. The nonvolatile memory cells MC sharing one of the local bit lines SBL have respective sources connected commonly to the corresponding one of the source lines SL. The source lines SL are connected to a common source line CSL via respective select switches 16. The ground voltage VSS of the circuit is applied to the common source line CSL. Each of the word lines is connected to the respective control gates of the nonvolatile memory cells MC in a row as a unit. Each of select signal lines DSL is connected to the respective select terminals of the disconnect switches 15 in a row as a unit, while each of select signal lines SSL is connected to the respective select terminals of the disconnect switches 16 in a row as a unit. The word line WL is selected in accordance with the result of decoding a lower-order address, while the select signals DSL and SSL are selected in accordance with the result of decoding an upper-order address. As a result, one of a plurality of strings sharing the global bit line GBL is selected and the local bit line LBL of the selected string is connected to the global bit line GBL.

Figure 3:
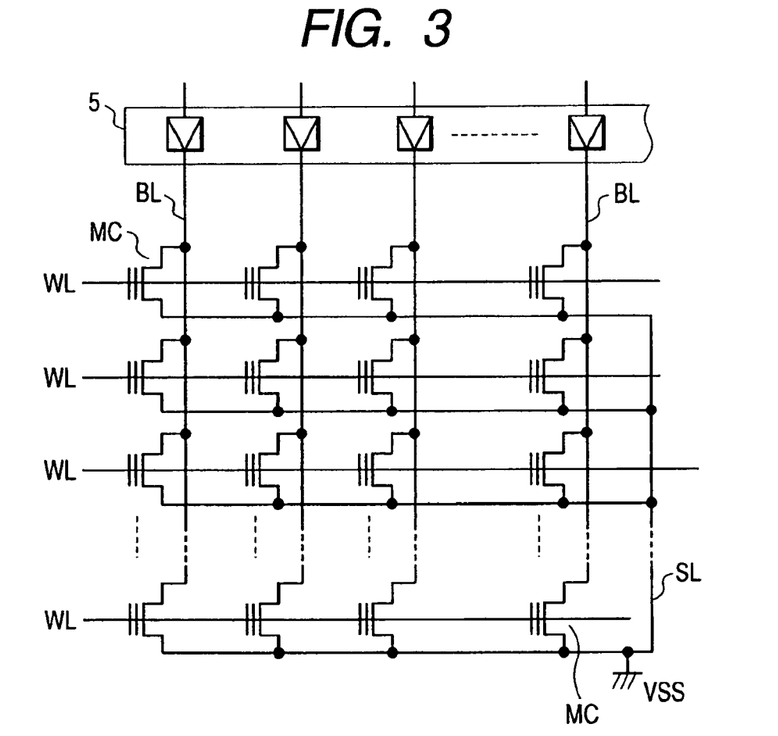
FIG. 3 is a circuit diagram showing another example of the memory array.

FIG. 3 shows another example of the memory array 2. In this example, the plurality of nonvolatile memory cells MC have the respective drains connected to each of the bit lines BL and the respective sources connected commonly to the source line SL. Each of the word lines WL is connected to the respective control gates of the nonvolatile memory cells in a row as a unit.

A description will be given herein below to relations among voltages applied to each of the nonvolatile memory cells MC during erasing, writing, and reading. An external source operating voltage VDD is assumed to be, e.g., 3.3 V. For example, Vd (drain voltage)=1 V, Vcg (control gate voltage)=3.8 V, Vs (source voltage)=0 V, and Vsub (substrate voltage)=0 V are assumedly satisfied for reading. For erasing, Vd=OP (floating), Vcg=−11 V, Vs=OP, and Vsub=10.5 V are assumedly satisfied. Based on the relations among the erase-related voltages, electrons injected into the floating gate are released into a substrate (well region) so that the threshold voltage viewed from the control gate is lowered. For writing, Vd=6 V, Vcg=10 V, Vs=0 V, and Vsub=0 V are assumedly satisfied. Based on the relations among the write-related voltages, a current flows from the drain to the source and generated hot electrons are injected into the floating gate so that the threshold voltage viewed from the control gate is raised. In accordance with another writing method, Vd=0 V, Vcg=10 V, Vs=0 V, and Vsub=0 V are assumedly satisfied. Based on the relations among the write-related voltages, electrons are injected into the floating gate by a FN tunneling effect between the drain-source channel region and the floating gate so that the threshold voltage viewed from the control gate is raised.

The procedure of an erase operation will be described. A description will be given first to a procedure of an erase operation according to a comparative example, which tolerates the occurrence of a depleted state halfway through the erase operation and finally corrects the depleted state in contrast to the present invention.

Figure 4:
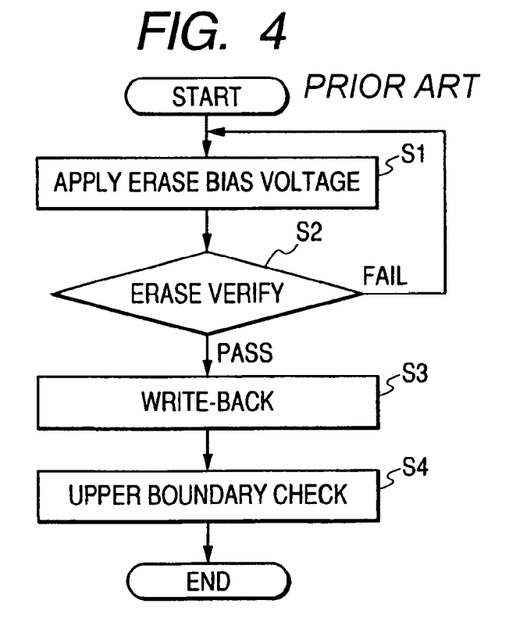
FIG. 4 is a flow chart showing the procedure of an erase operation according to a comparative example.

FIG. 4 shows the procedure of the erase operation according to the comparative example.

Figure 5:
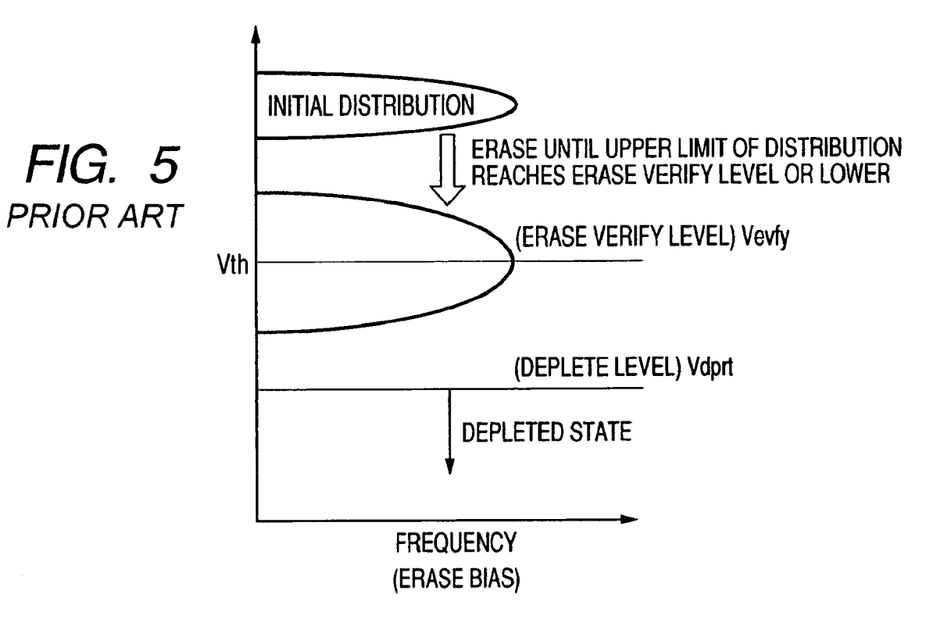
FIG. 5 is a view illustrating a threshold voltage distribution when an erase bias voltage is applied.

In Erase Bias Voltage Application Step S1, an erase bias voltage illustrated above as an erase-related voltage is applied to reduce the threshold voltages of the nonvolatile memory cells MC. At this time, the distribution of the threshold voltages of the plurality of nonvolatile memory cells MC sharing the select word line as a simultaneous erase unit has variations in accordance with erase speeds. For example, the initial distribution of the threshold voltages is lowered by Erase Bias Voltage Application Step S1, as shown in FIG. 5. The threshold voltage is shown as Vth.

Figure 6:
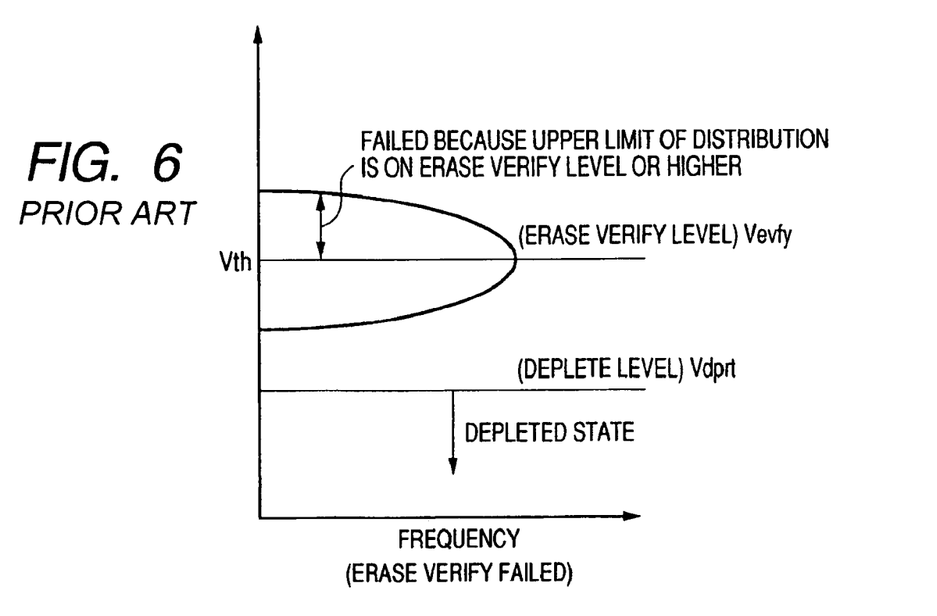
FIG. 6 is a view illustrating a threshold voltage distribution when an erase verify has failed.
Figure 7:
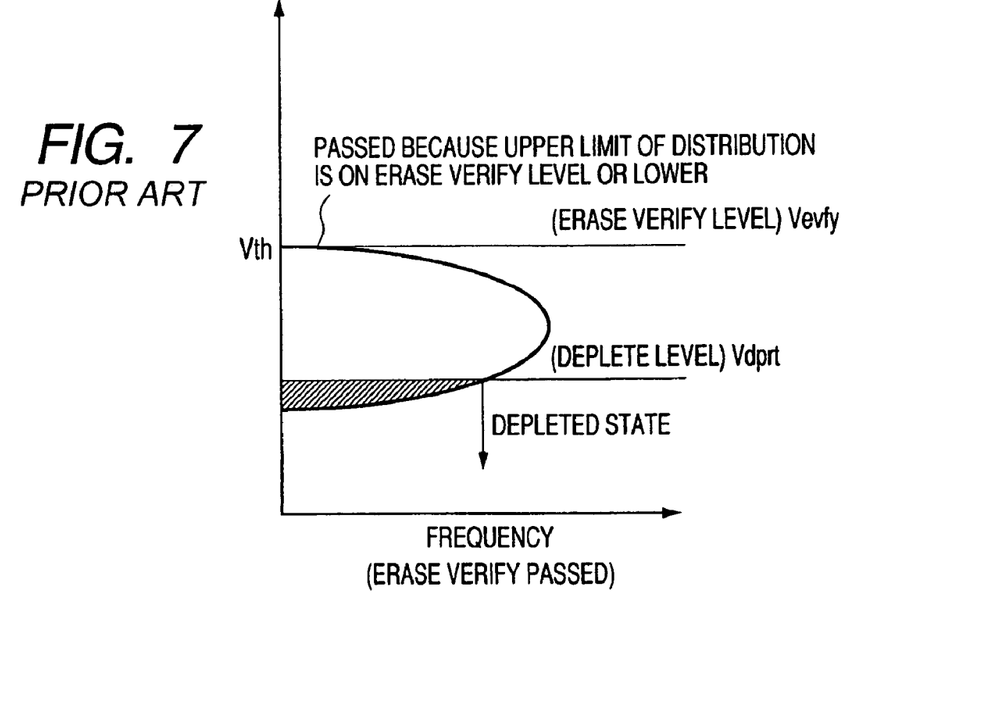
FIG. 7 is a view illustrating a threshold voltage distribution when an erase verify has passed.

In Erase Verify Step S2, it is checked whether or not the upper limit of the threshold voltage distribution after Erase Bias Voltage Application Step S1 is on the erase verify level Vevfy or lower. In the state of FIG. 6, the upper limit of the threshold voltage distribution is on the erase verify level Vevfy or higher so that it is judged to have failed. In the state of FIG. 7, the upper limit of the threshold voltage distribution is on the erase verify level Vevfy or lower so that it is judged to have passed. The erase bias voltage application in S1 and the erase verify in S2 are repeated until the erase verify is judged to have passed. At this time, since the threshold distribution has variations in accordance with erase characteristics, there are cases where the lower limit of the threshold voltage distribution reaches the deplete level Vdprt or lower, as illustrated in FIG. 7.

Figure 8:
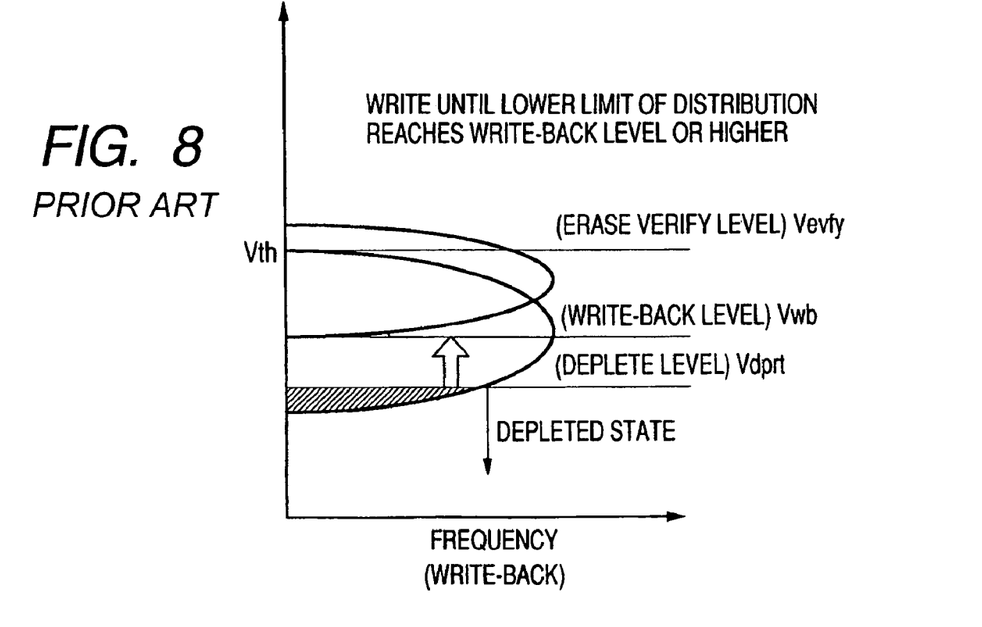
FIG. 8 is a view illustrating a threshold voltage distribution when a write-back operation is performed.
Figure 13:
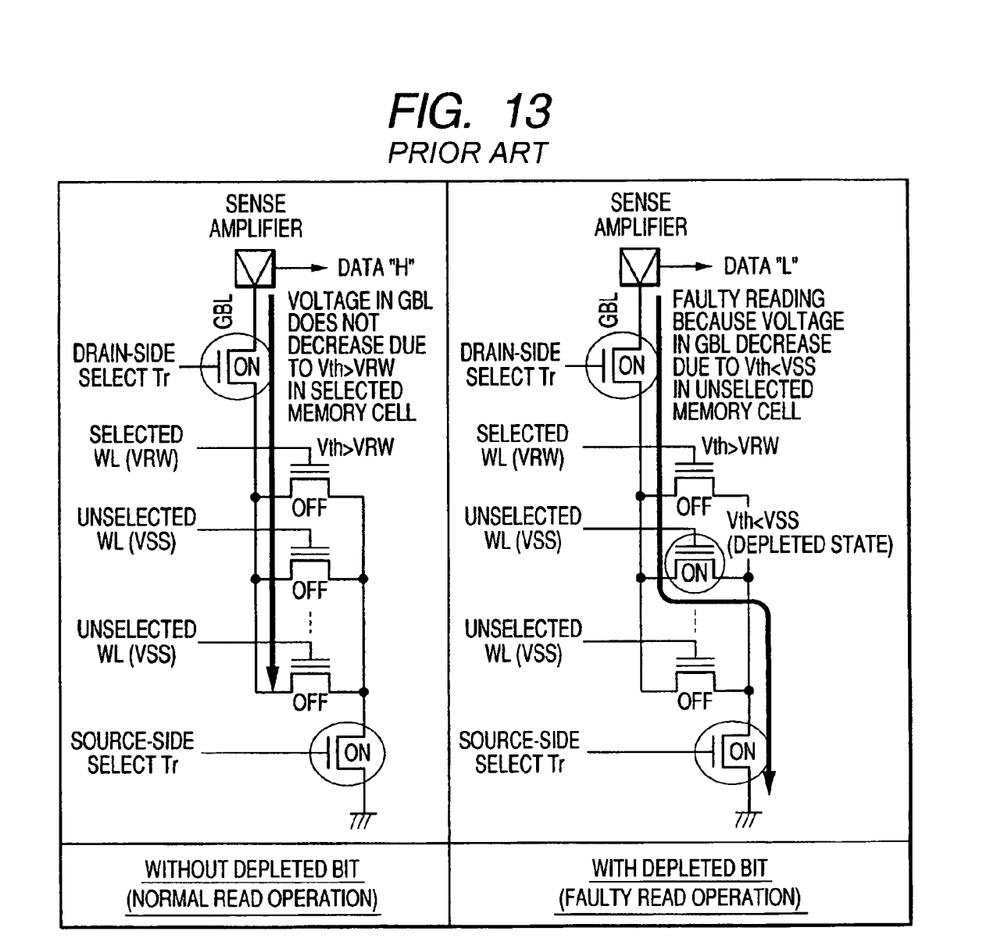
FIG. 13 is a view illustrating the difference between a read operation in the presence of depletion and a read operation in the absence of depletion.

In Write-Back Step S3, selective writing is performed to the nonvolatile memory cells MC on the write-back level Vwb or lower, thereby bringing the lower limit of the threshold voltage distribution to a level equal to or higher than the write-back level Vwb in the threshold voltage distribution after erasing, as illustrated in FIG. 8. At this time, since the nonvolatile memory cell MC that has been depleted halfway through the erase operation is also regarded as a target of the write-back operation, there is no depleted nonvolatile memory cell MC left if the write-back operation is completed normally. Conversely, if the erase operation is halted by the shutdown of the operating power source or the like before the write-back operation is completed normally, the depleted nonvolatile memory cell MC is left disadvantageously. As illustrated in, e.g., FIG. 13, the depleted nonvolatile memory cell MC is brought into the ON state even when the word line WL is unselected so that faulty data is read when the nonvolatile memory cell MC in the written state is to be selected.

Figure 9:
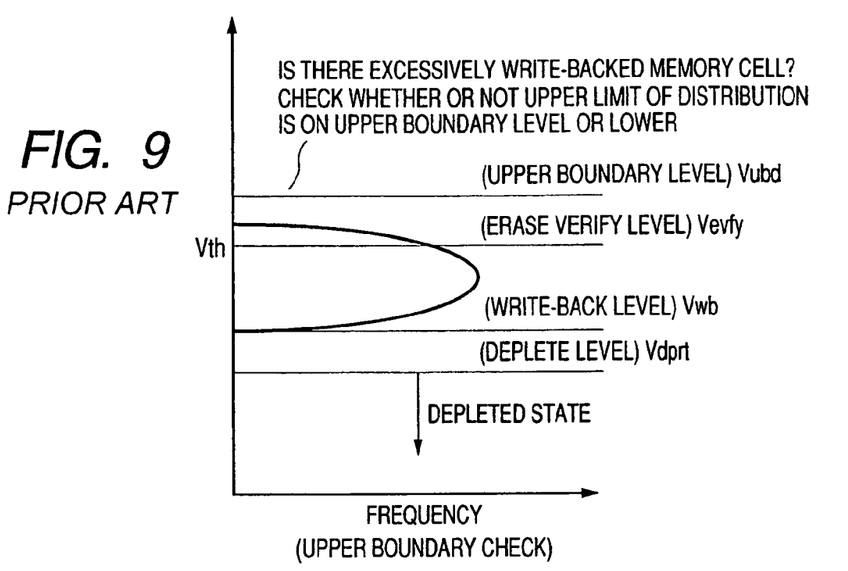
FIG. 9 is a view illustrating a threshold voltage distribution when an upper boundary check is performed.

In Upper Boundary Check Step S4, it is checked whether or not the excessively write-backed nonvolatile memory cells MC are present in the threshold voltage distribution after the write-back operation by checking that the upper limit of the threshold voltage distribution is on the upper boundary level Vubd or lower, as shown in FIG. 9. If it is sensed that the upper limit of the threshold voltage distribution is exceeding the upper boundary level Vubd in the upper boundary check, the erase operation is performed again, though it is not particularly depicted.

A description will be given next to the erase procedure according to the present invention.

Figure 10:
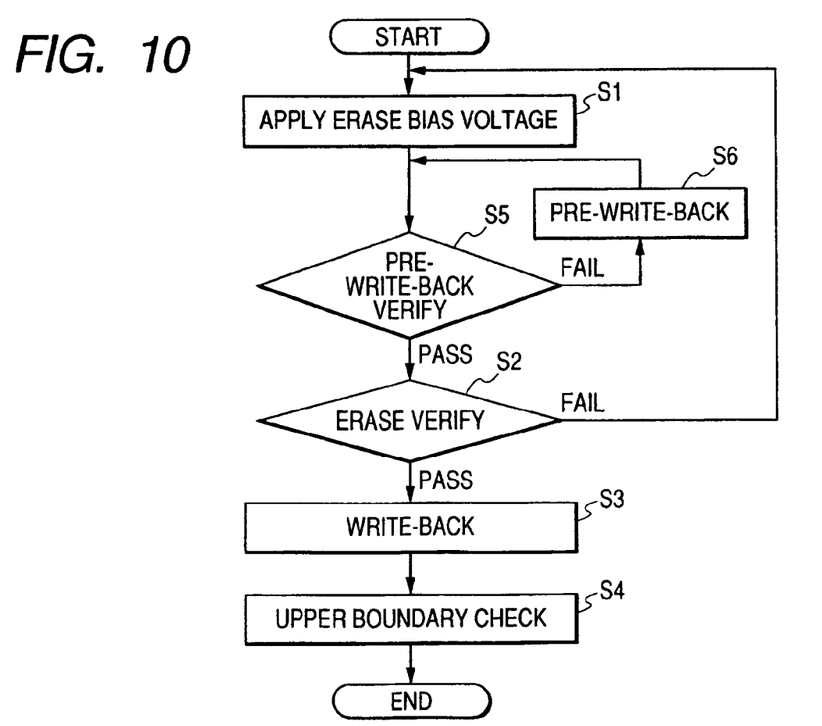
FIG. 10 is a flow chart showing an example of an erase procedure according to the present invention.

FIG. 10 shows an example of the erase procedure according to the present invention. The erase procedure of FIG. 10 is different from the erase procedure of FIG. 4 in that Pre-Write-Back Verify Step S5 and Pre-Write-Back Step S6 are inserted in a loop including Erase Bias Voltage Application Step S1 and Erase Verify Step S2.

Figure 11:
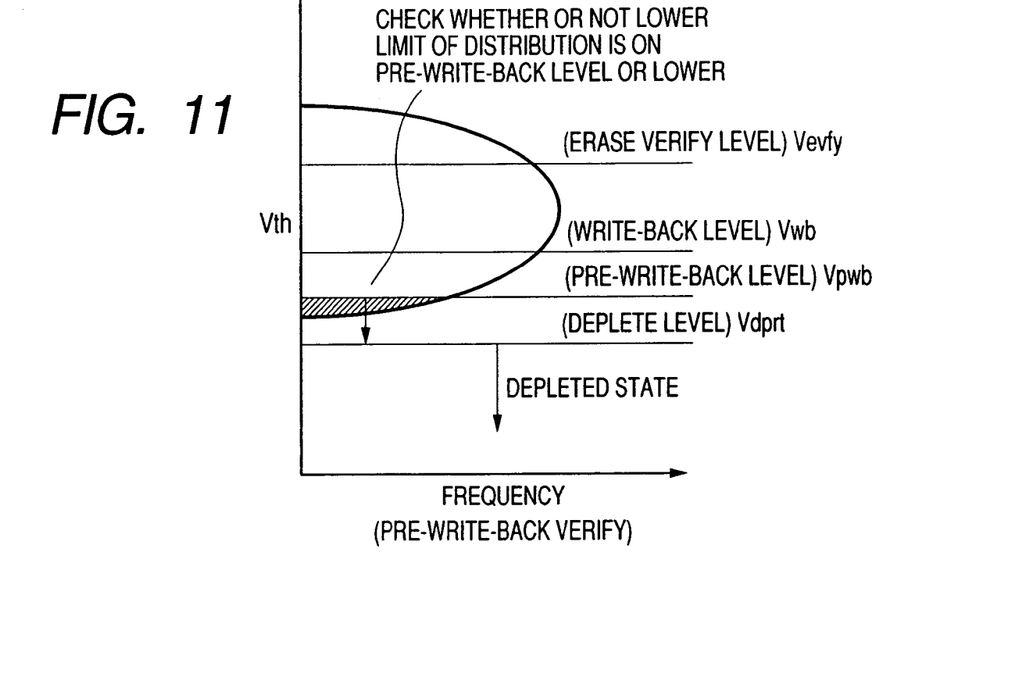
FIG. 11 is a view illustrating a threshold voltage distribution when a prewrite-back verify is performed.

In Pre-Write-Back Verify Step S5, as illustrated in FIG. 11, it is checked whether or not the lower limit of the threshold voltage distribution after Erase Bias Voltage Application Step S1 is on the pre-write-back level Vpwb or lower.

Figure 12:
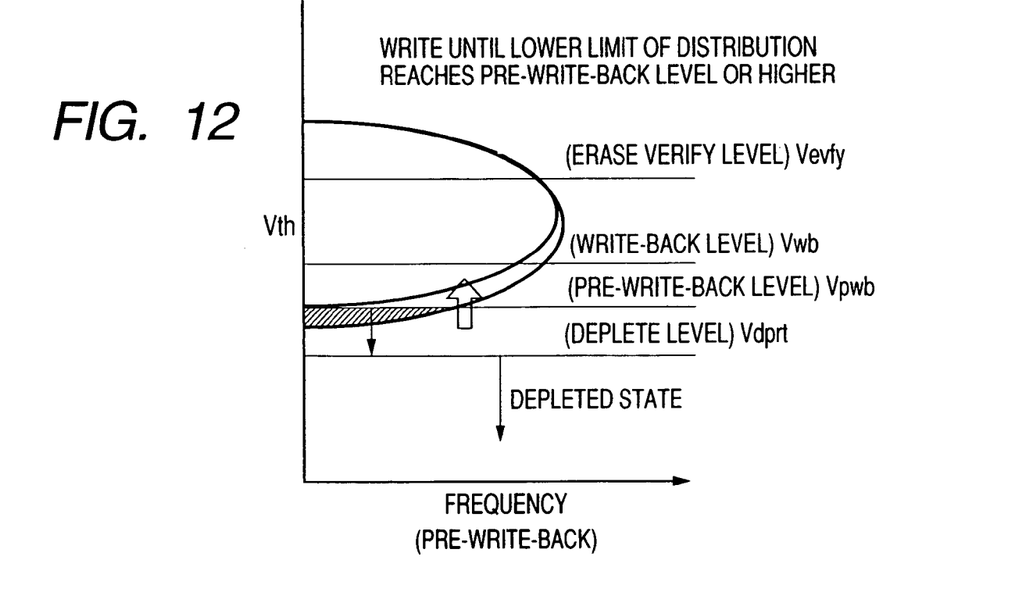
FIG. 12 is a view illustrating a threshold voltage distribution when a pre-write-back is performed.

In Pre-Write-Back Step S6, as illustrated in FIG. 12, selective writing is performed to the nonvolatile memory cell MC that has failed in Pre-Write-Back Verify Step S5, thereby bringing the lower limit of the distribution to a level equal to or higher than the pre-write-back level Vpwb.

As shown in FIGS. 11 and 12, the pre-write-back level has been set in a range not lower than the deplete level Vdprt and not higher than the write-back level Vwb. The setting allows coarse writing in the pre-write-back process and achieves a reduction in process time. This is because, since the width of the distribution after the pre-write-back process is larger than that in the write-back process in S3 (Upper Limit of Distribution—Pre-Write-Back Level Vpwb)>(Upper Limit of Distribution—Write-Back Level Vwb), the narrowing of the distribution can be controlled more widely in the latter pre-write-back process so that rough writing is sufficient. Rough writing or coarse writing indicates adjusting a write voltage to be higher than an initial write voltage in the write-back process in S3 or elongating a write pulse time.

In the case of a failure where the lower limit of the distribution is on the pre-write-back level Vpwb or lower, Pre-Write-Back Step S6 is performed. In the case of a pass where the lower limit of the distribution is constantly higher than the pre-write-back level Vpwb, Erase Verify Step S2 described above is performed to check the upper limit of the distribution. Since the processes in Steps S1 to S4 are the same as in the case of FIG. 4, the detailed description thereof will be omitted.

Thus, in the erase operation of FIG. 10, erasing can be completed without causing depletion halfway therethrough by performing Pre-Write-Back Step S6 to the nonvolatile memory cell MC which may potentially be depleted after the erase bias voltage application. By additionally setting the pre-write-back level Vpwb in the range higher than the deplete level Vdprt and not higher than the write-back level Vwb, coarse writing is allowed in each of the pre-write-back processes in S5 and S6 and, even though the pre-write-back processes in S5 and S6 have been added, an increase in process time can be minimized.

Figure 14:
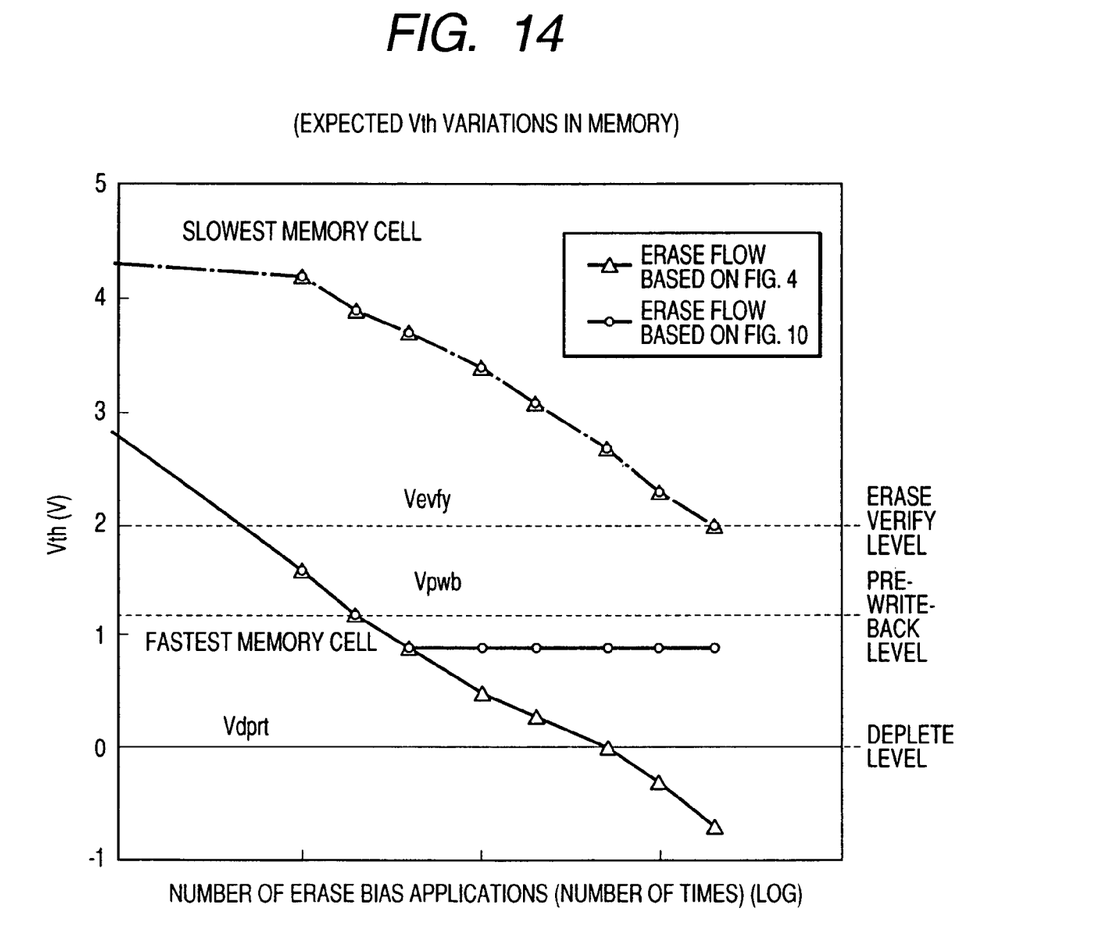
FIG. 14 is a view illustrating the tendency of variations in the respective threshold voltages of fastest and slowest nonvolatile memory cells in a threshold voltage distribution during an erase operation performed in accordance with the erase procedure of FIG. 10.

FIG. 14 shows the tendency of variations in the threshold voltages (Vth) of the respective nonvolatile memory cells MC at the highest and lowest erase speeds in the threshold voltage distribution during the erase operation using the erase procedure of FIG. 10. In the erase procedure of FIG. 4, the threshold voltage of the fastest nonvolatile memory cell continues to decrease with each application of the erase bias voltage to reach the deplete level Vdprt or lower. By contrast, Pre-Write-Back Step S6 is performed on each application of the erase bias voltage in the erase procedure of FIG. 10 so that the threshold voltage of the fastest nonvolatile memory cell does not reach a value equal to or lower than a given threshold voltage (Vpwb).

Figure 15:
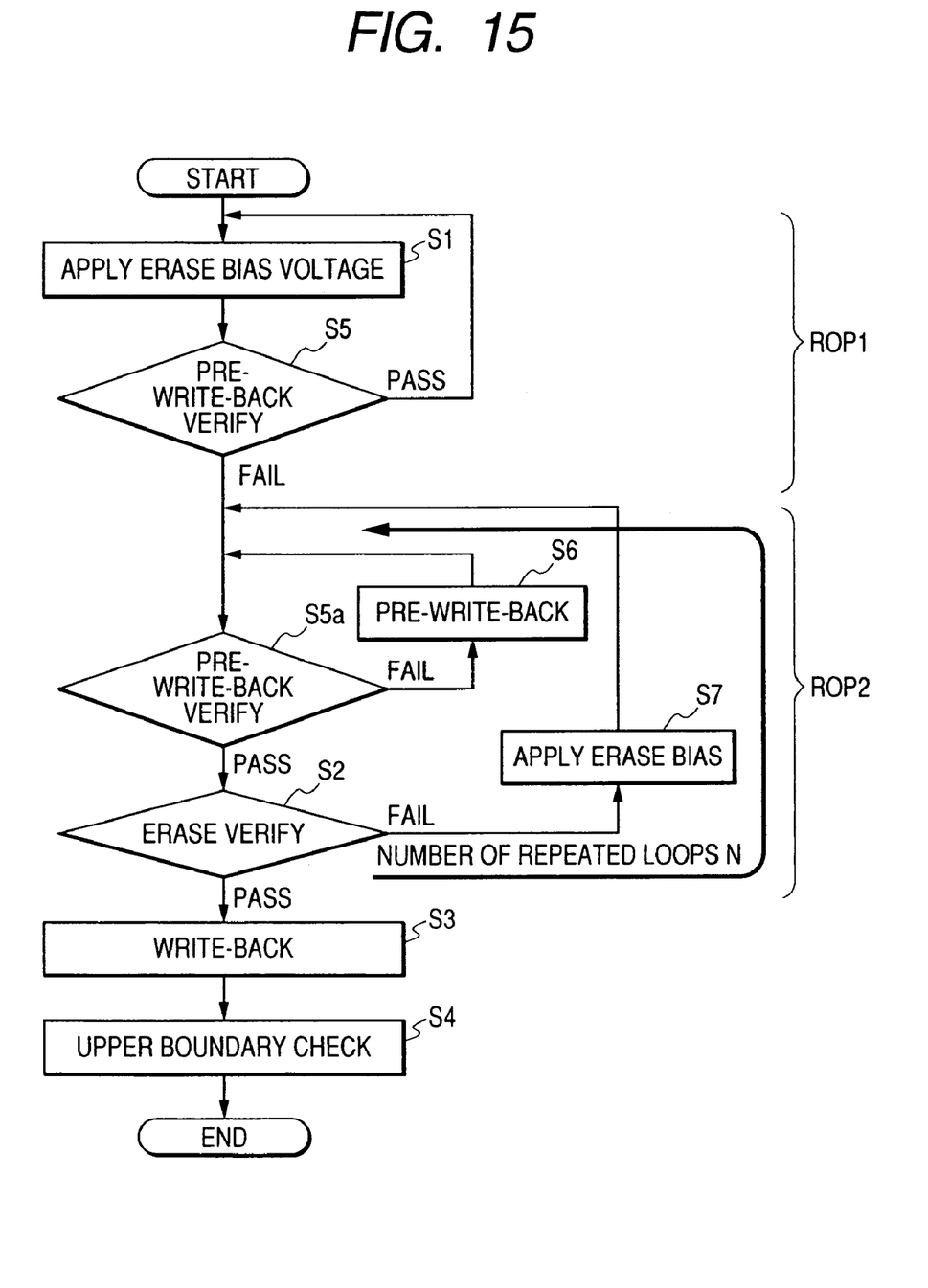
FIG. 15 is a flow chart showing another example of the erase procedure according to the present invention.

FIG. 15 shows another example of the erase procedure according to the present invention. In the foregoing erase procedure of FIG. 10, an erase time is conceivably increased compared with that in the erase procedure of FIG. 4 because Pre-Write-Back Step S6 is inserted in the loop including Erase Bias Voltage Application Step S1 and Erase Verify Step S2. That is, since Pre-Write-Back Step S6 is inserted in the loop including Erase Bias Voltage Application S1 in FIG. 10, switching should be performed between operating power sources for erasing and writing when Pre-Write-Back Step S6 is performed. This results in an overhead time which elongates the process time in the foregoing loop. If such an overhead time resulting from power source switching is added, the process time in Pre-Write-Back Step S6 becomes 200 microseconds, while the process time in Write-Back Step S3 is 20 microseconds. The procedure of the process in FIG. 15 aims at reducing the erase time by reducing such an overhead time.

In FIG. 15, Pre-Write-Back Verify Step S5 is performed after Erase Bias Voltage Application Step S1. If the pre-write-back verify has passed, Erase Bias Voltage Application Step S1 is repeated without performing an erase verify check. The repetitive loop forms a first loop ROP1. In the first loop ROP1, an erase bias voltage is applied continuously (S1) until the lower limit of a distribution in the memory (nonvolatile memory cell at a high erase speed) after erasing reaches the pre-write-back verify level Vpwb or lower (becomes a potentially depleted memory cell) so that a useless erase verify operation is omitted. This is because it is substantially insignificant to perform the erase verify process under a situation where, even when the nonvolatile memory cell at a high erase speed becomes a potentially depleted memory cell, the nonvolatile memory cell at a low erase speed has not reached the erase verify level Vevfy yet. After the pre-write-back verify has failed once in Step S5, a second loop ROP2 including Erase Bias Voltage Application Step S7 and Erase Verify S2 is repeated, Pre-Write-Back Verify Step S5$a$ is performed halfway through the second loop ROP2, and Pre-Write-Back Step S6 is performed when the lower limit of the threshold voltage distribution exceeds the pre-write-back level Vpwb.

In Erase Bias Voltage Application Step S7, the erase bias voltage is applied at a time during a period corresponding to the cumulative time of erase bias voltage application spent in the first loop ROP1. In this sense, the number of times N the second loop ROP2 is repeated can be reduced and the overall overhead time resulting from the write/erase switching operation in the loop can be reduced. In short, the cumulative time of erase bias voltage application performed in the first loop ROP1 until Pre-Write-Back Verify Step S5 has initially failed becomes an erase pulse width which is optimum for the erase characteristic of the erase operation at that time in a sense that the nonvolatile memory cell at a high erase speed is not depleted. By adjusting the width of the erase pulse to a value corresponding to the width of the erase pulse applied at a time in Erase Pulse Application S7, the number of times the second loop ROP2 is performed can be reduced so that the erase operation is performed at a higher speed.

For example, if an external power source voltage VDD=3.3 V is satisfied, it is assumed that the erase verify level Vevfy=2.8 V, the write-back level Vwb=1.8 V, and the like are satisfied.

Figure 16:
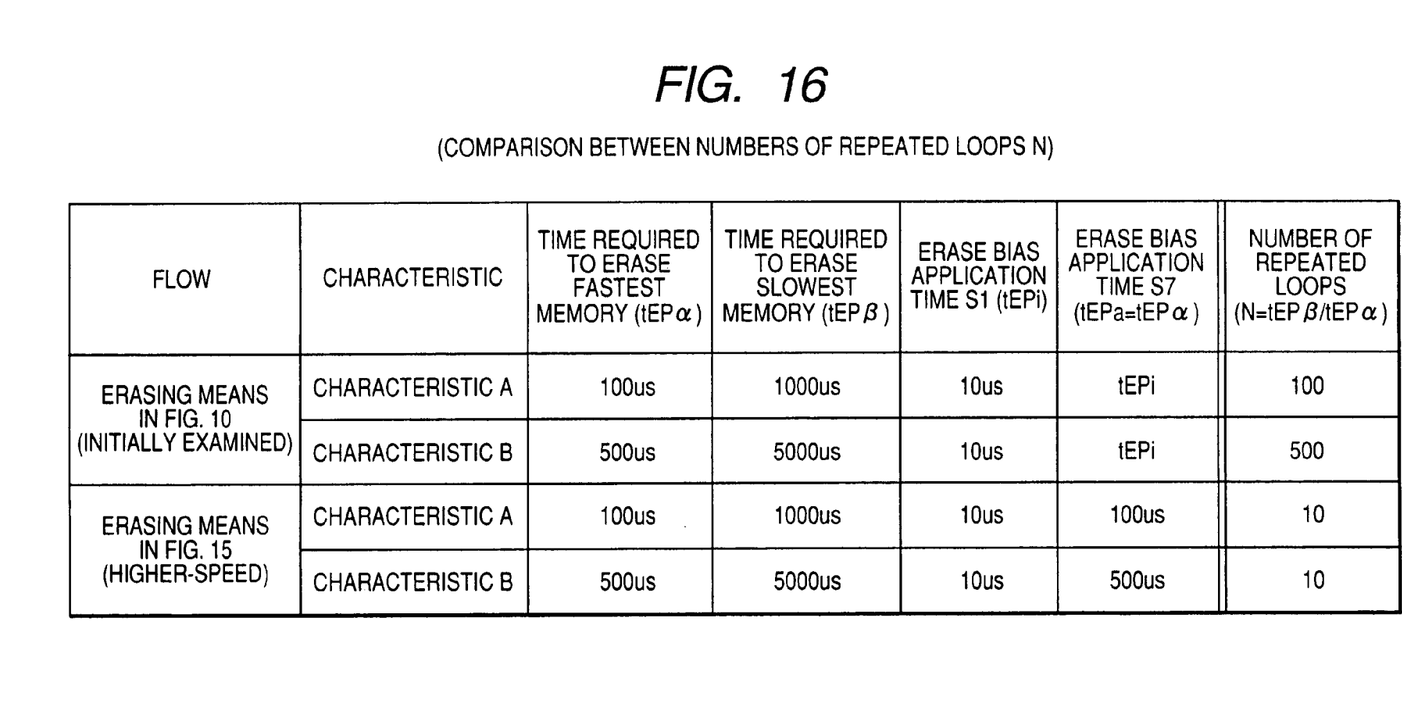
FIG. 16 is a view illustrating a logical example of the effect of reducing the number of loops achieved by the erase procedure of FIG. 15 in contrast to the erase procedure of FIG. 10.

FIG. 16, illustrates a logical example of the effect of reducing the number of loops achieved by the erase procedure of FIG. 15 in contrast to the erase procedure of FIG. 10. In FIG. 16, the difference (change) in threshold xvoltage characteristic between the fastest nonvolatile memory and the slowest nonvolatile memory is assumedly fixed to, e.g., 1 V. The column of Initially Examined indicates the case using the erase procedure of FIG. 10 and the column of Higher-Speed indicates the case using the erase procedure of FIG. 15. It is assumed that tEPα indicates the total time of erase bias voltages application required to bring the nonvolatile memory cell at the highest erase speed into an erased state, tEPβ indicates the total time of erase bias voltage application required to bring the nonvolatile memory cell at the lowest erase speed into an erased state, and tEPi which is a time required for one session of erase bias voltage application in Step S1 is uniformly 10 microseconds (μs). The time tEPα required for one session of erase bias voltage application in Step S7 is as short as tEPi (=10 μs) in the procedure of FIG. 10. By contrast, the time tEPα in the procedure of FIG. 15 is a cumulative time of erase bias voltage application in the first loop ROP1, which is equal to tEPα and therefore relatively long. If the number of loops of erase bias voltage application required to complete, erasing is considered to approximate to the number of loops N (=tEPβ/tEPα) of erase bias voltage application required to bring the slowest nonvolatile memory cell into the erased state, it is 10 (Characteristic A) and 10 (Characteristic B) in the erase procedure of FIG. 15, while it is 100 (Characteristic A) and 500 (Characteristic B) in the erase procedure of FIG. 10. Although a total time of actual erase bias voltage application remains unchanged in the case of FIG. 10 and in the case of FIG. 15, the overhead time spent to switch the erase voltage or the like in the loop is reduced significantly since the number of times the loop is repeated is smaller in the case of FIG. 15. Thus, when erasing is performed for the characteristics A and B, the number of times is common to the different characteristics A and B in the procedure of FIG. 15, while the number of loops becomes larger as the total time of erase bias voltage application required to erase the nonvolatile memory cell at the lowest erase speed is longer in the erase procedure of FIG. 10. Therefore, it will be understood that erasing can be achieved in a smaller number of loops in the procedure of FIG. 15 than in the procedure of FIG. 10.

Figure 17:
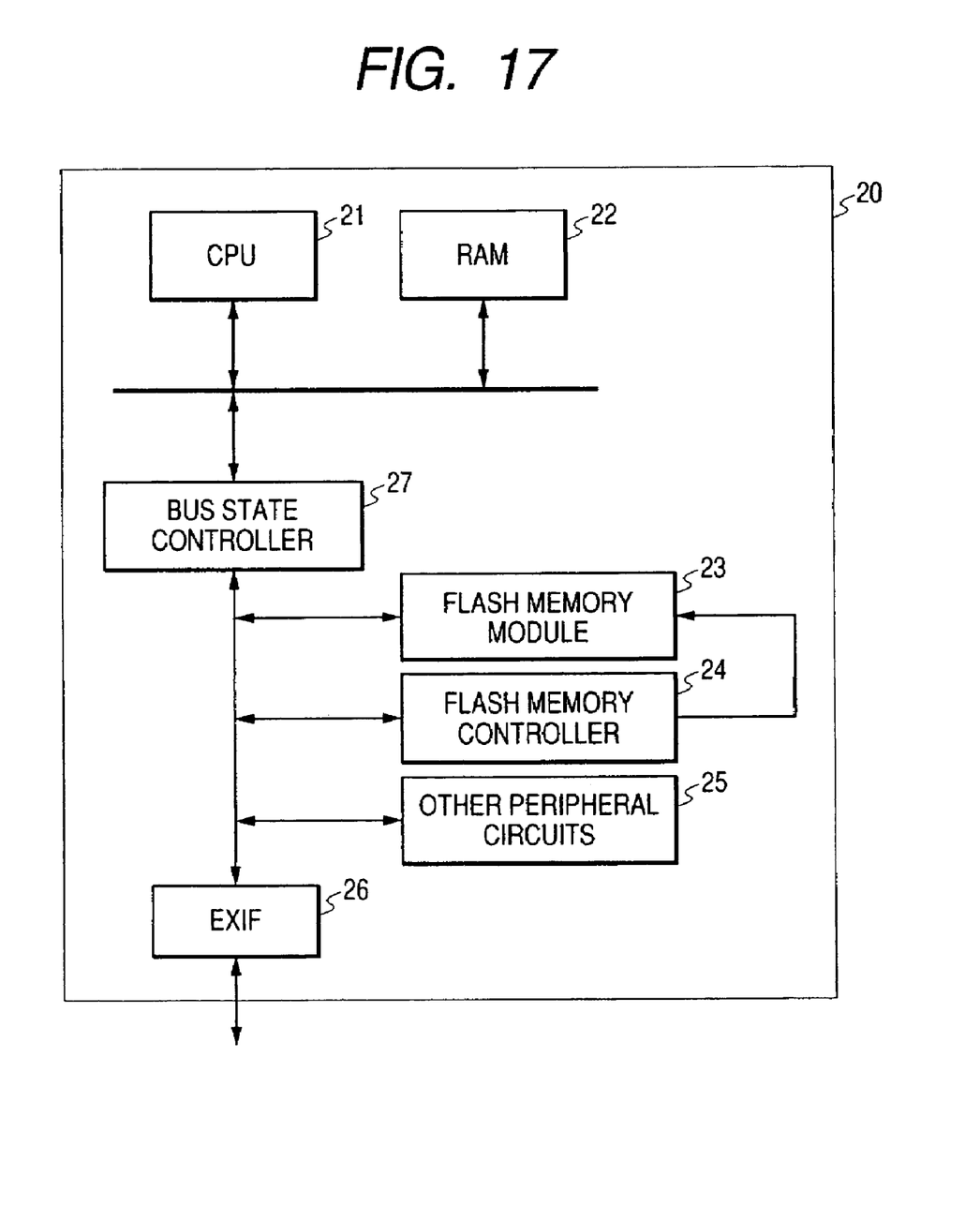
FIG. 17 is a block diagram of a microprocessor according to an example of the present invention.

FIG. 17 illustrates a microprocessor according to an example of the present invention. A microprocessor 20 is constituted by: a central processing unit (CPU) 21; a random access memory (RAM) 22 used as a work region for the CPU 21; a bus state controller 27; a flash memory module 23 storing therein an operating program for the CPU 21, control data, and the like; a flash memory controller 24 composing the control logic of the flash memory module 23; other peripheral circuits 25 including a timer, a serial interface controller, and the like; and an external bus interface circuit (EXIF) 26. The flash memory module 23 and the flash memory controller 24 compose the foregoing flash memory 1. The flash memory controller 24 implements the control circuit 10 of the flash memory 1. The flash memory controller 24 receives an access command from the CPU 21 and controls each of the read, erase, and write operations to the flash memory module 23. The erase sequence illustrated above with reference to FIGS. 10 and 15 is controlled by the flash memory controller 24. Each of the erase and write operation sequences may also be controlled directly by the CPU 21 instead of the flash memory controller 24, though it is not particularly depicted. In this case, control programs for erase and write operations may be held appropriately in a protected region allocated to a specified memory array 2 in the flash memory module 23. Erasing and writing to the protected region are disabled in an on-board state in which the microprocessor 20 is mounted on a mounting board.

Although the specific description has been given thus far to the embodiments of the invention achieved by the present inventors, the present invention is not limited to the foregoing embodiments. It will easily be appreciated that various modifications and changes can be made without departing from the gist thereof.

For example, although the erase speed has been increased in the erase procedure of FIG. 15 by varying the erase pulse time between Erase Bias Voltage Application Step S1 in the first loop ROP1 and Erase Bias Voltage Application Step S7 in the second loop ROP2 and thereby reducing the number of loops, the same effects may also be achieved by stepwise increasing the erase voltage, not the pulse time. For example, the erase voltage may be increased gradually in Erase Bias Voltage Application Step S1 and erasing may be performed appropriately in Erase Bias Voltage Application Step S7 by using an erase voltage when it becomes lower than the pre-write-back verify level in Erase Bias Voltage Application Step S1. This similarly reduces the number of loops and implements higher-speed erasing.

The writing method in the write-back process or the pre-write-back process during the erase operation can be implemented by either FN tunnel writing or hot electron writing. It is also possible to operate the two types of writing methods in parallel.

Although it has been assumed that the pre-write-back verify level is set in the range not lower than the deplete level and not higher than the write-back level by way of example, the same level as the write-back level may also be used. Since coarse writing cannot be used for the pre-write-back process, the process time is elongated but the process itself is executable.

The definitions of the erased state and the written state may also be switched to each other. That is, a state with a higher threshold voltage is defined as the erased state and a state with a lower threshold voltage is defined as the written state.

The structure of the nonvolatile memory cell is not limited to a stacked gate structure. For example, the nonvolatile memory cell may also have a split gate structure in which a select transistor portion is disposed in separated and series relation between the source and drain. The charge accumulation region of the nonvolatile memory cell is not limited to polysilicon and may also be composed of a charge trapping insulating film such as a silicon nitride film.

An erase unit is not limited to a word line. The erase unit may also be a unit sharing a source line or a unit sharing a well region. An information storage unit for the nonvolatile memory cell is not limited to 1 bit and may also be a plurality of bits such as 2 bits.

What is claimed is:

1. A semiconductor integrated circuit comprising:
nonvolatile memory cells each having a threshold voltage which can be changed reversibly by electrical erasing and writing; and
a control circuit that controls the changing of the threshold voltage of each said nonvolatile memory cell,
wherein said control circuit controls an erase process of performing simultaneous erasing to a plurality of the nonvolatile memory cells assigned to one unit in an erase operation, a first write process of performing writing to at least one nonvolatile memory cell assigned to said one unit, based on a determination that the threshold voltage associated with said at least one nonvolatile memory cell has exceeded, in an erase direction, a first reference voltage level that is located between a lower limit voltage for a final erase distribution and a voltage level defining entry into a depletion state, and a second write process of performing, after a determination that all of the threshold voltages of the nonvolatile memory cells of the unit exceed, in the erase direction, a higher limit voltage of said erase distribution, writing to at least one nonvolatile memory cell of the unit based on a determination that the threshold voltage associated with that at least one nonvolatile memory cell has exceeded, in the erase direction, a second level located at said lower limit voltage for the final erase distribution.

2. The semiconductor integrated circuit according to claim 1, wherein said erasing lowers the threshold voltage of each of the nonvolatile memory cells and said writing increases the threshold voltage of the nonvolatile memory cell.

3. The semiconductor integrated circuit according to claim 1,
wherein a write voltage in said first write process is higher than a write voltage in said second write process.

4. The semiconductor integrated circuit according to claim 1,
wherein an application time in which a write voltage is applied in said first write process is longer than an application time in which a write voltage is applied in said second write process.

5. The semiconductor integrated circuit according to claim 1,
wherein said first level is closer than said second level to said voltage level defining entry into the depletion state, and
wherein said second level is between said first level and an erase level indicating a limit of the threshold voltage distribution in a counter-erase direction.

6. The semiconductor integrated circuit according to claim 5,
wherein said erase process causes the threshold voltage distribution in the counter-erase direction to reach an erase limit by repeating an erase verify operation which determines whether or not the limit of the threshold voltage distribution in the counter-erase direction has reached an erase determination level and by applying an erase voltage when the erase determination level has not been reached.

7. The semiconductor integrated circuit according to claim 6,
wherein said first write process brings the limit of the threshold voltage distribution in the erase direction within a range not exceeding said first level by repeating a first write verify that determines whether or not the limit of the threshold voltage distribution in the erase direction exceeds said first level and by application of a first write voltage when a result of the first write verify indicates the first level is exceeded in the erase direction.

8. The semiconductor integrated circuit according to claim 7,
wherein said control circuit repeats a loop including said application of the erase voltage and said erase verification, performs the first write verify partway through the loop, and applies the first write voltage when the limit of the threshold voltage distribution in the erase direction exceeds said first level.

* * * * *